(12) United States Patent
Wang et al.

(10) Patent No.: US 9,312,815 B2
(45) Date of Patent: Apr. 12, 2016

(54) BROADBAND INTEGRATED RF/MICROWAVE/MILLIMETER MIXER WITH INTEGRATED BALUN(S)

(71) Applicant: LINEAR TECHNOLOGY CORPORATION, Milpitas, CA (US)

(72) Inventors: Xudong Wang, Colorado Springs, CO (US); William B. Beckwith, Colorado Springs, CO (US); Thomas E. Schiltz, Colorado Springs, CO (US)

(73) Assignee: LINEAR TECHNOLOGY CORPORATION, Milpitas, CA (US)

( * ) Notice: Subject to any disclaimer, the term of this patent is extended or adjusted under 35 U.S.C. 154(b) by 0 days.

(21) Appl. No.: 14/632,692

(22) Filed: Feb. 26, 2015

(65) Prior Publication Data

US 2015/0341014 A1   Nov. 26, 2015

Related U.S. Application Data

(60) Provisional application No. 62/002,473, filed on May 23, 2014.

(51) Int. Cl.
| | |
|---|---|
| *H03H 11/32* | (2006.01) |
| *H03D 7/00* | (2006.01) |
| *H03H 7/42* | (2006.01) |
| *H01P 5/10* | (2006.01) |

(52) U.S. Cl.
CPC . *H03D 7/00* (2013.01); *H03H 7/42* (2013.01); *H03H 11/32* (2013.01); *H01P 5/10* (2013.01); *H03D 2200/0023* (2013.01)

(58) Field of Classification Search
CPC ............. H03D 7/00; H03D 7/14; H03H 7/42; H03H 7/422; H03H 11/32

USPC ............ 327/355, 356, 357, 359; 333/4, 5, 25, 333/26; 455/326, 327, 333

See application file for complete search history.

(56) References Cited

U.S. PATENT DOCUMENTS 6,094,570 A   7/2000   Consolazio
(Continued)

FOREIGN PATENT DOCUMENTS

| EP | 0647021 A1 | 4/1995 |
|---|---|---|
| WO | 2013-001743 A1 | 1/2013 |

OTHER PUBLICATIONS

Linear Technology Corporation. LTC 5549: 2GHz to 14GHz Microwave Mixer with Integrated LO Frequency Doubler. Linear Technology Corporation, 2015. 20 pages.

Linear Technology Corporation. LTC 5576: 3GHz to 8GHz High Linearity Active Upconverting Mixer. Linear Technology Corporation, 2015. 24 pages.

(Continued)

*Primary Examiner* — William Hernandez
(74) *Attorney, Agent, or Firm* — McDermott Will & Emery LLP (57) ABSTRACT

A broadband radio frequency, microwave, or millimeter mixer system may include a balun and a mixer. The balun may have an unbalanced port; a balanced port; a first and a second inductor tightly and inversely magnetically coupled to one another; and a third inductor which is not magnetically coupled to the first or the second inductors. The mixer may be connected to the balanced port of the balun. The balun, including its three inductors, and the mixer may all be integrated onto a single substrate that forms an integrated circuit.

20 Claims, 10 Drawing Sheets

(56) References Cited

U.S. PATENT DOCUMENTS

| | | | |
|---|---|---|---|
| 6,154,026 A * | 11/2000 | Dantsker | G01R 33/022 324/225 |
| 2009/0276262 A1 | 11/2009 | Yotsukura et al. | |
| 2010/0045400 A1 | 2/2010 | Wu et al. | |
| 2010/0231316 A1 | 9/2010 | Jiang | |

OTHER PUBLICATIONS

European Patent Office. 2015. Extended European Search Report dated Sep. 29, 2015 for Corresponding European Application 15001518.8, entitled "Broadband Integrated RF/Microwave/Millimeter Mixer with Integrated Balun(s)." 7 pages.

* cited by examiner

BROADBAND INTEGRATED RF/MICROWAVE/MILLIMETER MIXER WITH INTEGRATED BALUN(S)

CROSS-REFERENCE TO RELATED APPLICATION

This application is based upon and claims priority to U.S. provisional patent application 62/002,473, entitled "Novel Balun Topologies for High Frequency, Broadband Integrated Circuits," filed May 23, 2014. The entire content of this application is incorporated herein by reference.

BACKGROUND

1. Technical Field

This disclosure relates to RF/microwave/millimeter mixers and baluns.

2. Description of Related Art

Broadband mixers may need to be made with lumped elements or other structures compatible with IC fabrication techniques and geometries.

Balanced mixers may provide better overall performance over unbalanced mixers, including better linearity, noise, and port to port isolation.

Baluns may be used in single balanced mixers and double balanced mixers to convert radio frequency (RF), local oscillator (LO) and intermediate frequency (IF) signals between balanced and unbalanced configurations. The baluns may also need to be integrated using standard IC foundry processes so that broadband integrated mixers can be produced.

Important performance parameters for a mixer may include conversion gain, linearity, noise, and operating bandwidth. Baluns may be used in integrated mixers and may have a significant impact on all of these performance parameters. Important performance parameters for an integrated balun may include operating frequency range, insertion loss, amplitude/phase balance, impedance matching/transformation and physical size.

Unfortunately, it may be very difficult to achieve a desired set of needed parameters with an integrated balun.

SUMMARY

A broadband radio frequency, microwave, or millimeter mixer system may include a balun and a mixer. The balun may have an unbalanced port; a balanced port; a first and a second inductor tightly and inversely magnetically coupled to one another; and a third inductor which is not magnetically coupled to the first or the second inductors. The mixer may be connected to the balanced port of the balun. The balun, including its three inductors, and the mixer may all be integrated onto a single substrate that forms an integrated circuit.

These, as well as other components, steps, features, objects, benefits, and advantages, will now become clear from a review of the following detailed description of illustrative embodiments, the accompanying drawings, and the claims.

BRIEF DESCRIPTION OF DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

FIGS. 12A and 12B compare the performance of an example of the balun shown in FIG. 9 with a traditional balun. FIG. 12A compares phase difference, while FIG. 12B compares amplitude balance.

DETAILED DESCRIPTION OF ILLUSTRATIVE EMBODIMENTS

Illustrative embodiments are now described. Other embodiments may be used in addition or instead. Details that may be apparent or unnecessary may be omitted to save space or for a more effective presentation. Some embodiments may be practiced with additional components or steps and/or without all of the components or steps that are described.

This disclosure describes integrated broadband RF/microwave/millimeter mixers that may use one of various balun topologies to achieve higher operating frequency and broader bandwidth. One mixer may use a balun configuration that provides very broadband operation due to much lower parasitic capacitance compared with a traditional transformer based balun. Another mixer may use a traditional transformer based balun, but may also use an asymmetrical layout of an unbalanced winding to realize improved performance.

Figure 1:
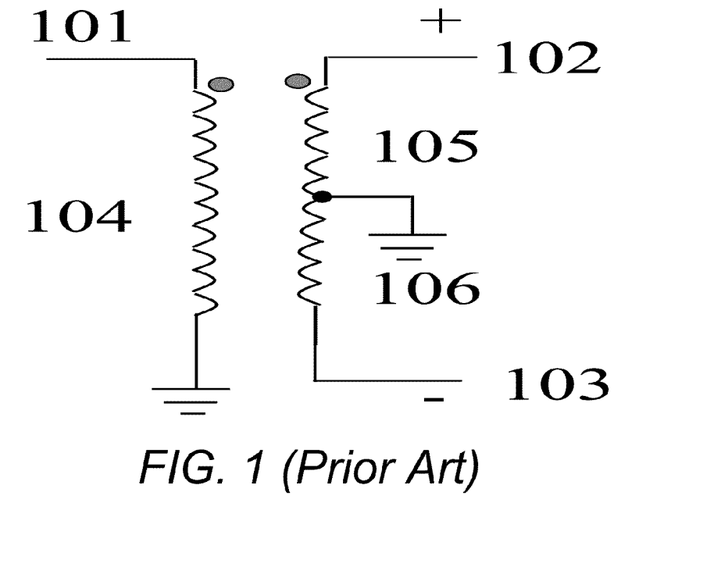
FIG. 1 illustrates a schematic of an example of a prior art transformer based balun.

FIG. 1 illustrates a schematic of an example of a prior art transformer based balun. The balun may include an inductor 104 that may serve as a primary winding and inductors 105 and 106 that may serve as secondary windings. The balun may have an unbalanced port 101 and a balanced port 102/103.

Figure 2:
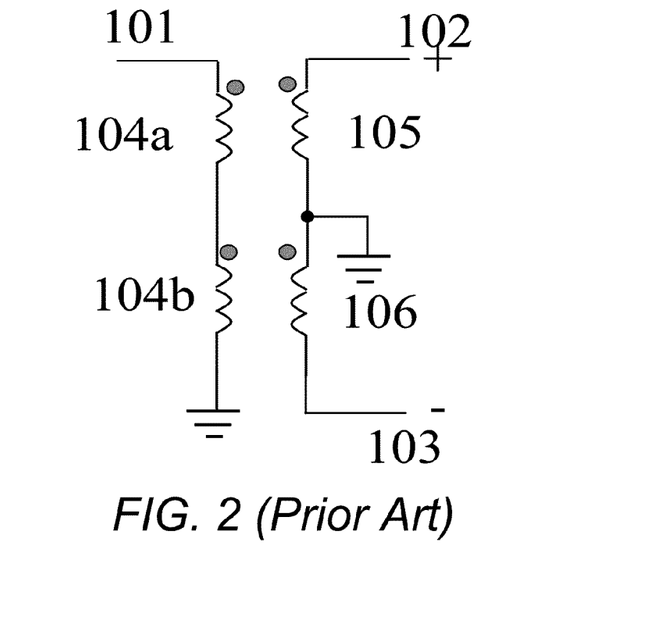
FIG. 2 illustrates a schematic of another example of a prior art transformer based balun.

FIG. 2 illustrates a schematic of another example of a prior art transformer based balun. In this example, the balun may include separate inductors 104a and 104b in place of inductor 104 in FIG. 1 as primary windings.

The primary inductor (or inductors) and secondary inductors may be DC isolated, but magnetically coupled to allow signal transfer from one side to the other side. In the examples of FIGS. 1 and 2, the primary winding may be "unbalanced" and the secondary winding may be "balanced".

In order for a traditional transformer balun to have good performance, the self-impedances of the primary and secondary inductors may need to be much higher than the terminal impedance for efficient magnetic coupling. Thus, the lowest frequency of operation may dictate the amount of inductance required in the balun. The upper end of the operating frequency may be limited by parasitic capacitance, in part because it may resonate with the inductors. These limitations can make it difficult for a traditional balun to operate over a broad frequency range because the lowest frequency may require large dimensions to achieve high inductance, while the highest frequency may require small dimensions for low parasitic capacitance.

Ideal amplitude and phase balance between the plus and minus terminals may also require perfect magnetic coupling between the primary and secondary windings. It may not be possible to achieve perfect magnetic coupling, even in the best environments, but especially in an integrated environment. Also, the parasitic capacitance of the balanced winding may not be symmetrical due to coupling of segments of the balanced winding to the grounded end of the unbalanced winding. The most significant contribution to this imbalance may be the parasitic capacitance located along the grounded end of the primary inductor 104 or 104a and 104b.

Figure 3:
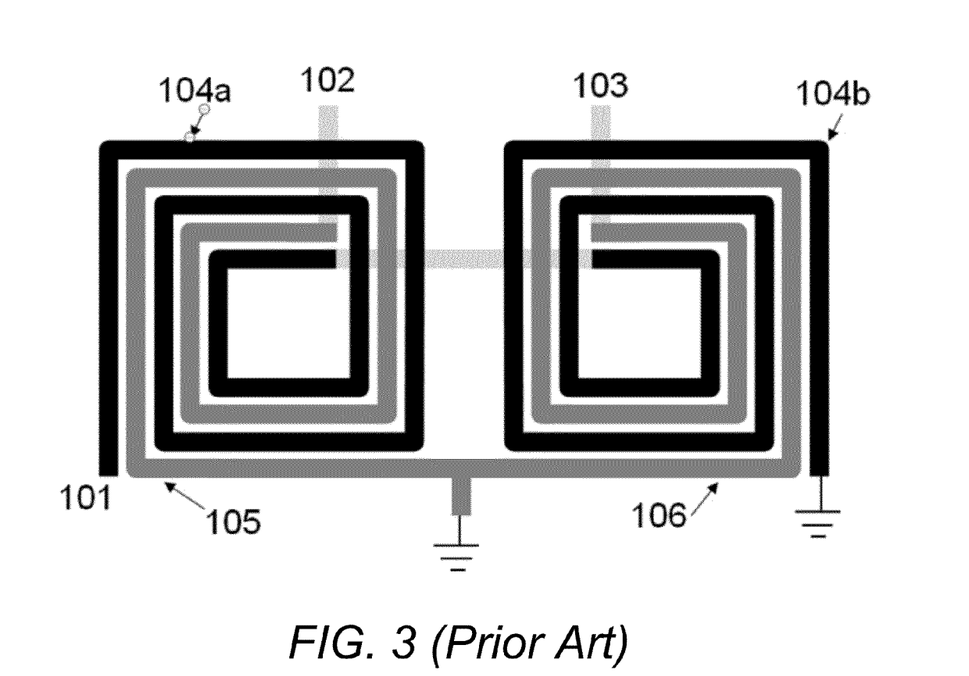
FIG. 3 illustrates an integrated circuit layout of an example of a prior art on-chip balun that has two separate spiral wound coupled inductors that are symmetrical and a grounded center-tap on the secondary.

FIG. 3 illustrates an integrated circuit layout of an example of a prior art on-chip balun that has two separate spiral wound baluns that are symmetrical and a grounded center-tap on the secondary.

Figure 4:
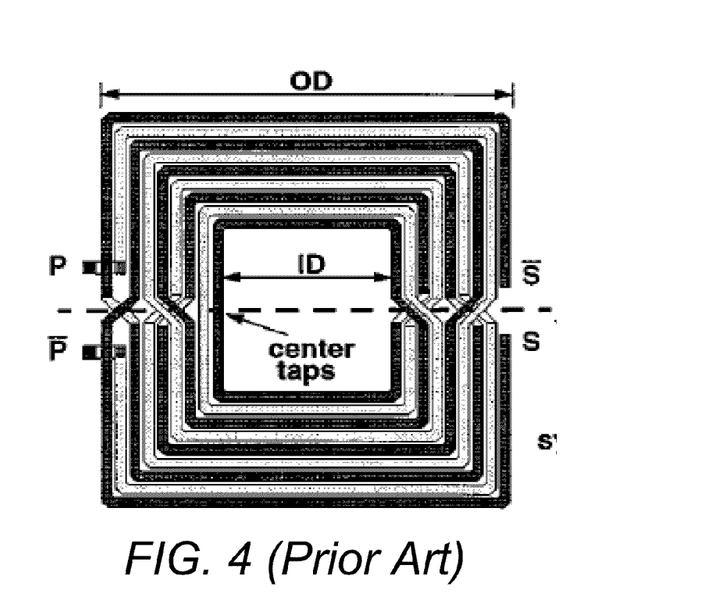
FIG. 4 illustrates an integrated circuit layout of an example of a prior art on-chip balun that has spiral windings with underpasses that are more symmetrical than a traditional spiral.

FIG. 4 illustrates an integrated circuit layout of an example of a prior art on-chip balun that has spiral windings with underpasses that are more symmetrical than a traditional spiral. This balun may provide a more area-efficient structure compared to using separate transformers, as illustrated in FIG. 3.

Other broadband prior art baluns may have three inductor wires around a magnetic core (or cores) and operate up to a few GHz art. See C. L. Ruthroff, "Some Broad-Band Transformers," Proceedings of the IRE, Volume 47, August 1959, pages 1337-1342; Richard H. Turrin, W2IMU, "Application of Broad-Band Balun Transformers," QST, April 1969, pages 42, 43; and U.S. Pat. No. 6,133,525, "Miniature Low Cost Modular Assembly Package and Method of Assembly", October 2000.

Figure 5:
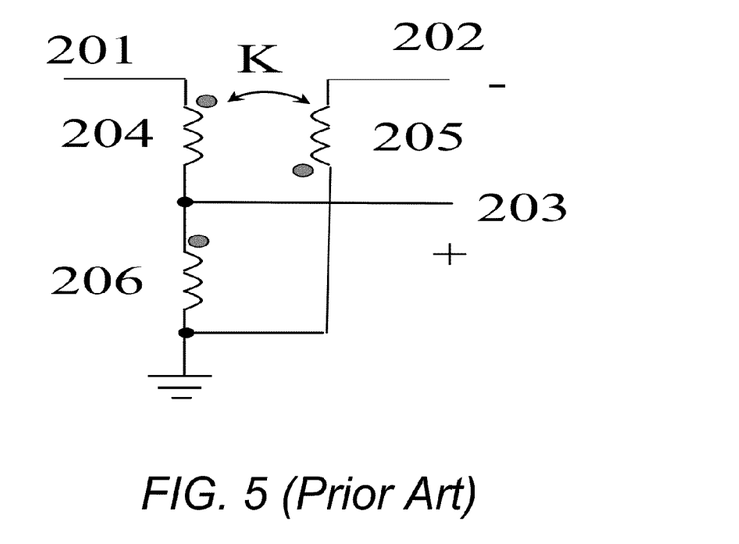
FIG. 5 illustrates a schematic of an example of a prior art balun that may have three inductor wires wound around a magnetic core (or cores) and operate up to a few GHz.

FIG. 5 illustrates a schematic of an example of a prior art balun that may have three inductor wires around a magnetic core (or cores) and operate up to a few GHz art. To have good balun performance, a first inductor 204 and a second inductor 205 may need to be magnetically coupled tightly, while a third inductor 206 may need to be magnetically isolated from the other two inductors 204 and 205. Th balun may have an unbalanced port 201 and a balanced port 202/203.

Figure 6:
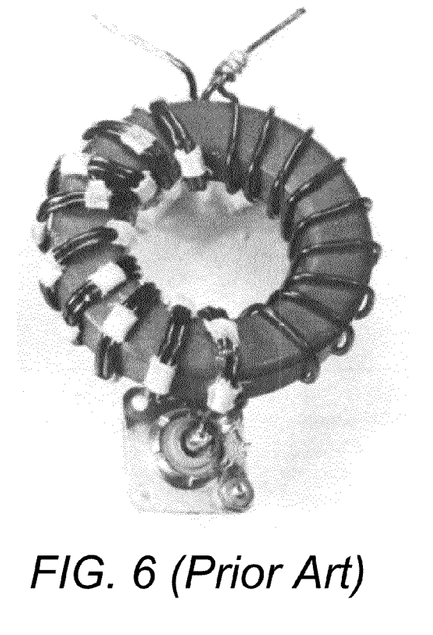
FIGS. 6-8 are photographs of examples of prior art baluns that may be constructed with wires wrapped around magnetic cores.
Figure 7:
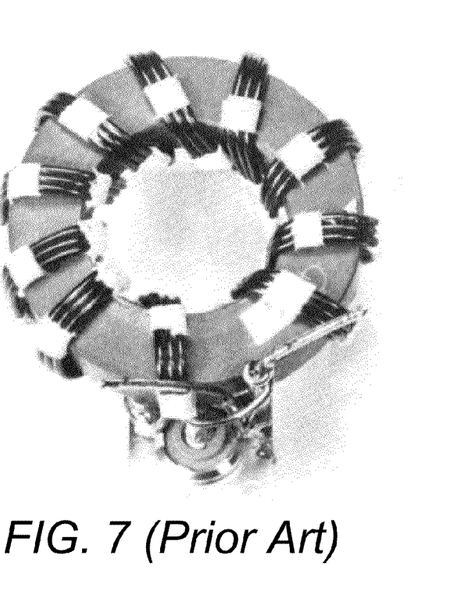
Figure 8:
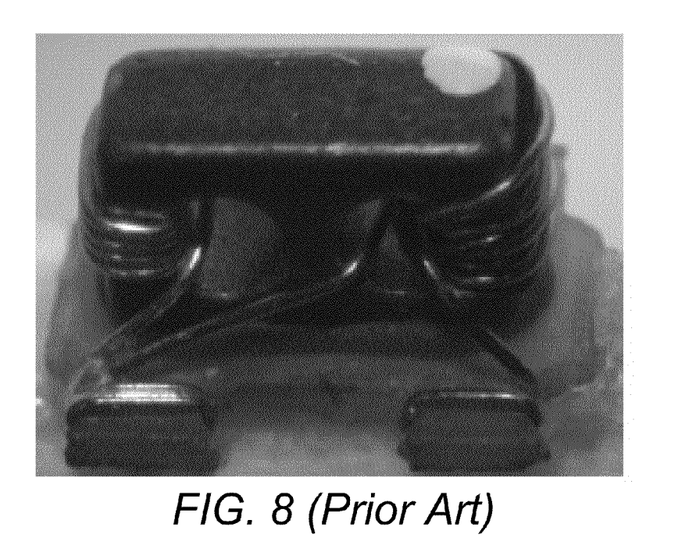

FIGS. 6-8 are photographs of examples of baluns prior art that may be constructed with wires wrapped around magnetic cores. All three-inductor baluns in the prior art may be built with wires wrapped on magnetic cores. This may be bulky and operate poorly at frequencies higher than several GHz. Furthermore, it may be difficult to integrate any of these baluns with mixers due to physical size limitations.

The discussion below will describe a three inductor balun topology that is built in an integrated circuit with a planar structure, instead of a wire/magnetic core structure. The three inductor balun may be constructed on one or more metal layers using standard semiconductor IC processes. The balun may be small in size and no magnetic core may be needed. This may result in broader bandwidth and better amplitude and phase balance as compared to traditional on-chip balun structures.

The discussion below will also describe a transformer layout topology in which the physical layout of an unbalanced winding may be modified to reduce the effects of a grounded terminal on overall performance.

Balun Topology #1: Planar Broadband Three Inductor Balun

An important factor for integrated circuits may be die size. A balun may need to be small enough so that it can be efficiently integrated on an IC. Also, the smaller size of the balun may reduce the cost of the final IC product.

The balun may also need to allow for convenient connection to other circuit blocks (such as a broadband mixer and/or LO amplifier). Physically short connections may be needed to minimize parasitic inductance, capacitance, and resistance.

Figure 9:
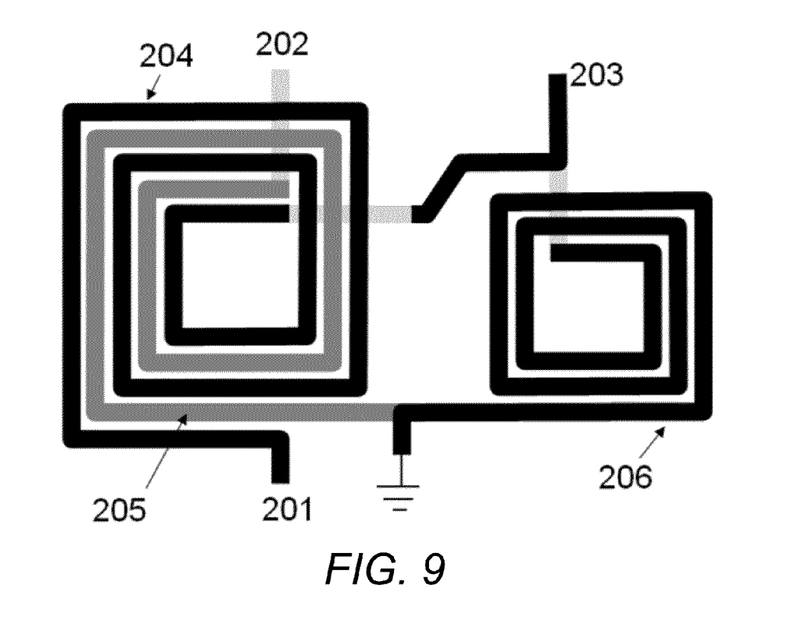
FIGS. 9, 10, and 11 illustrate examples of planar, broadband three-inductor baluns that may be used in integrated circuits.
Figure 10:
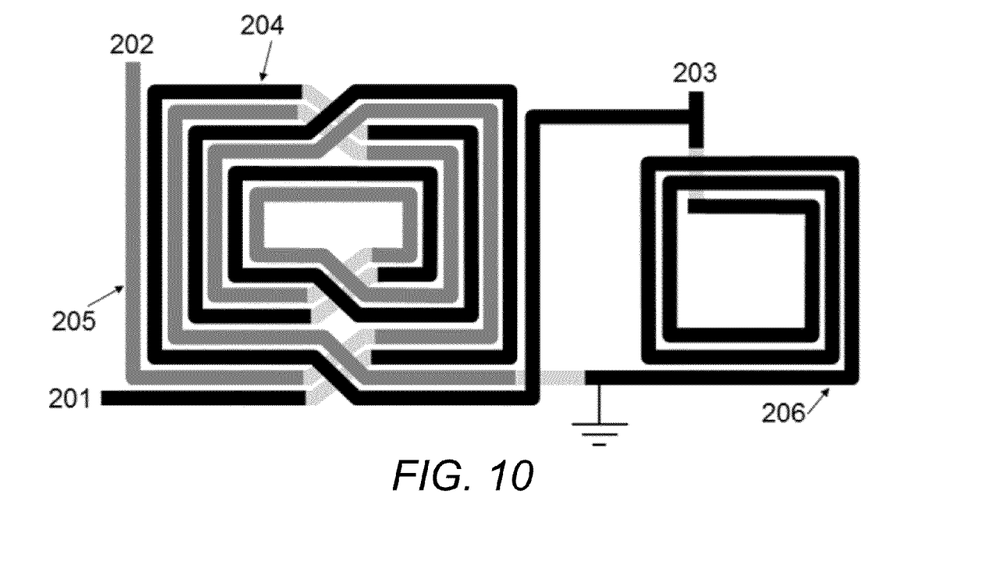
Figure 11:
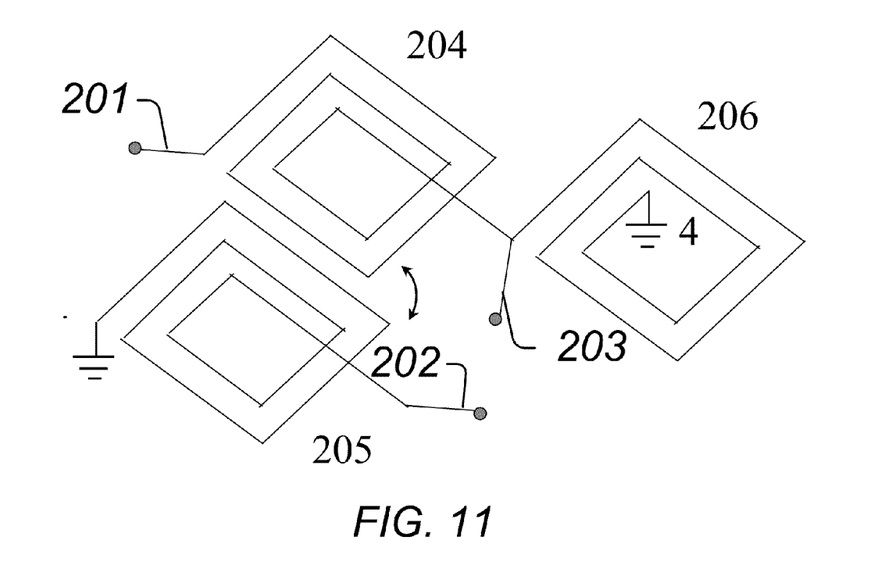

FIGS. 9, 10, and 11 illustrate examples of planar, broadband three-inductor baluns that may be used in integrated circuits.

FIGS. 9 and 10 illustrated integrated circuit layouts. The baluns illustrated in FIGS. 9 and 10 may have two metal layers in a standard semiconductor process. The top metal layer may be thicker than the other metal layer to minimize conductive loss. The top metal layer may also sit high above a lossy substrate, which may result in less parasitic capacitance for the baluns.

In FIGS. 9, 10, and 11, the inductors 204 and 205 in FIG. 5 may be realized using closely coupled metal traces that are tightly magnetically coupled. The third inductor 206 may be realized as a separate inductor separated from the coupled inductors 204 and 205. The inductor 206 may be magnetically isolated from the inductors 204 and 205.

When an unbalanced signal is applied at the unbalanced port 201, a balanced signal may be generated at the balanced port 202/203. The input signal applied at the unbalanced port 201 may be voltage divided by the impedances of the inductors 204 and 206. This may result in the output at 203 having the same phase (non-inverted) as the input signal at the unbalanced port 201.

The inductors 204 and 205 may be negatively coupled magnetically. This may result in a phase inversion at 202. Hence, the signal phase at 202 may be 180 degrees different from the phase at 203. Conversely, if a differential signal is applied to the balanced port 202/203, they may be combined together and output from the unbalanced terminal 201.

In FIG. 9, the inductors 204 and 205 may be routed side-by-side. The inductance of the inductor 205 may be lower than that of the inductor 204 if both metal traces have the same width and number of segments. The relative inductances of 204 and 205 can be optimized by adjustment of the individual metal trace widths and/or number of segments.

In FIG. 10, the inductors 204 and 205 may be routed symmetrically so that their inductance values are better matched. However, underpasses and vias may be needed. This may result in more contact and metal resistance.

The baluns in FIGS. 9-11 may achieve excellent amplitude and phase balance over a much wider frequency range than may be possible with traditional baluns.

The coupled inductors 204 and 205 can be realized using two inductors at different metal layers. FIG. 11 is an example of this.

Figure 12A:
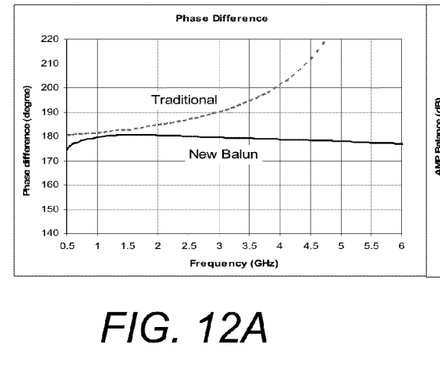
Figure 12B:
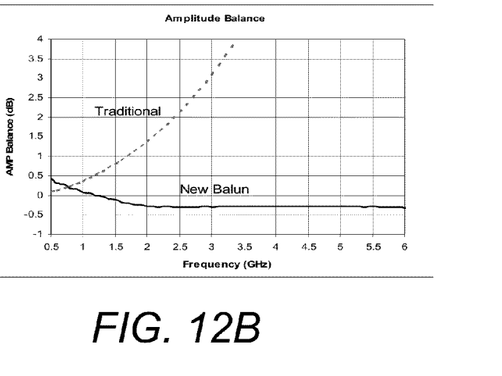

FIGS. 12A and 12B compare the performance of an example of the balun shown in FIG. 9 with a traditional balun. FIG. 12A compares phase difference, while FIG. 12B compares amplitude balance. Both of the baluns were optimized for the frequency range of 500 MHz to 3 GHz. As shown in FIGS. 12A and 12B, the FIG. 9 balun may exhibit excellent amplitude and phase balance from 500 MHz to beyond 6 GHz. However, the performance of the traditional balun may degrade quickly as frequency increases, making it useful from 500 MHz to only 3 GHz.

Broadband Topology #2: Improved Balun Layout Topology with Lower Insertion Loss

Figure 13:
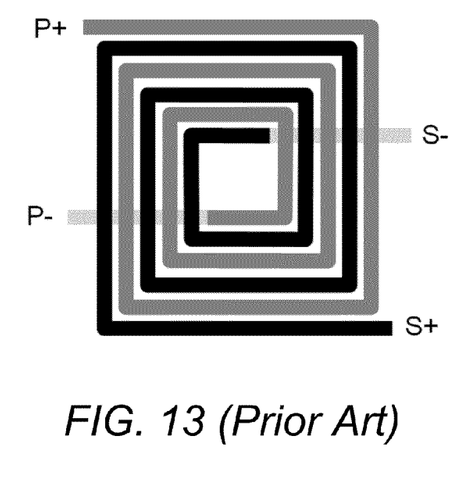
FIG. 13 illustrates an integrated circuit layout of an example of a prior art transformer topology that uses spirals on both the primary and secondary sides.

FIG. 13 illustrates an integrated circuit layout of an example of a prior art transformer topology that uses spirals on both the primary and secondary sides. One disadvantage of this approach may be that the structure is asymmetrical, since one terminal of each winding connects at the center-most end, while the other terminal connects to the outermost winding. This layout configuration can cause asymmetrical electrical characteristics for each terminal and result in degraded performance. The exact placement of a center tap may also be difficult to determine.

Figure 14:
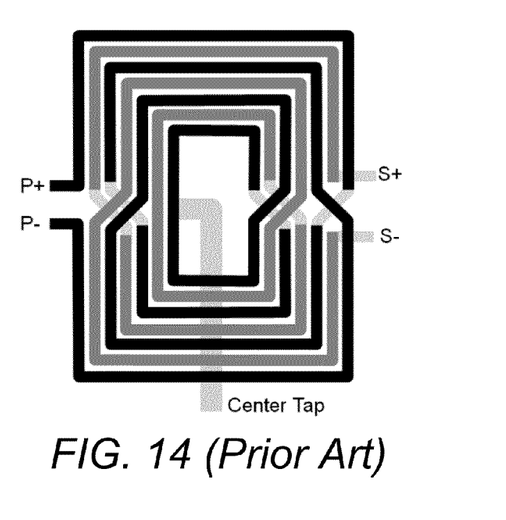
FIG. 14 illustrates an integrated circuit layout of an example of a prior art transformer topology that uses spirals on both the primary and secondary sides, both of which have been intertwined to improve electrical symmetry.

FIG. 14 illustrates an integrated circuit layout of an example of a prior art transformer topology that uses spirals on both the primary and secondary sides, both of which have been intertwined to improve electrical symmetry. All four of the terminals may be connected to outer segments of the windings.

When a transformer is used as a balun, one terminal on the unbalanced side may be connected to a low impedance ground node. In this case, having a physically symmetrical output winding, as in FIG. 14, may be a disadvantage, since one of the balanced input lines may be more tightly coupled to the grounded node than the other input line. This may create electrical asymmetry at the balanced ports. This may significantly degrade the performance, which may result in increased insertion loss.

Figure 15:
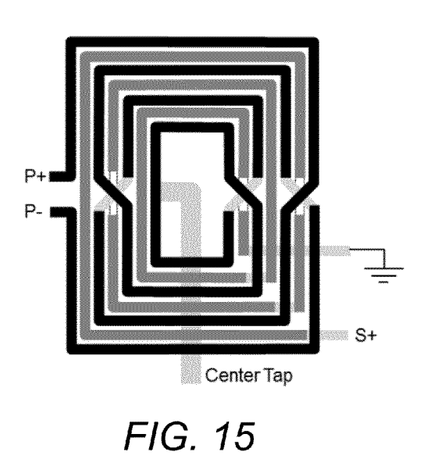
FIGS. 15 and 16 illustrate a schematic (FIG. 15) and integrated circuit layout (FIG. 16) of an example of balun with a balanced port and an unbalanced port.
Figure 16:
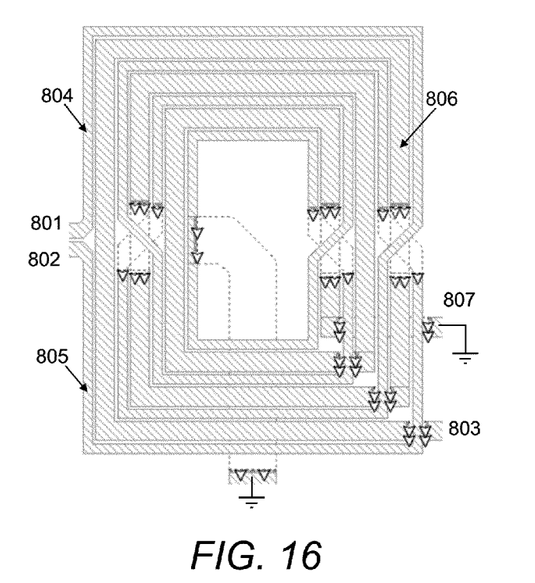

FIGS. 15 and 16 illustrate a schematic (FIG. 15) and an integrated circuit layout (FIG. 16) of an example of a balun with a balanced port 801/802 and an unbalanced port 803. This transformer may take advantage of the symmetrical structure on balanced side windings 804 and 805, but uses a traditional spiral on the unbalanced winding 806. The unbalanced winding 806 may be connected to ground through an inner-most end 807 of the winding 806. This is where the coupling between the balanced and unbalanced windings may be lowest. The outer-most turn of the unbalanced winding may be used as a signal for the unbalanced port 803. With this configuration, the outer-most turns of the balanced windings may be most tightly coupled to the outer-most turns of the unbalanced windings.

Both topologies may be used in an integrated mixer design to achieve broad bandwidth with improved performance as contrasted to traditional baluns.

Figure 17:
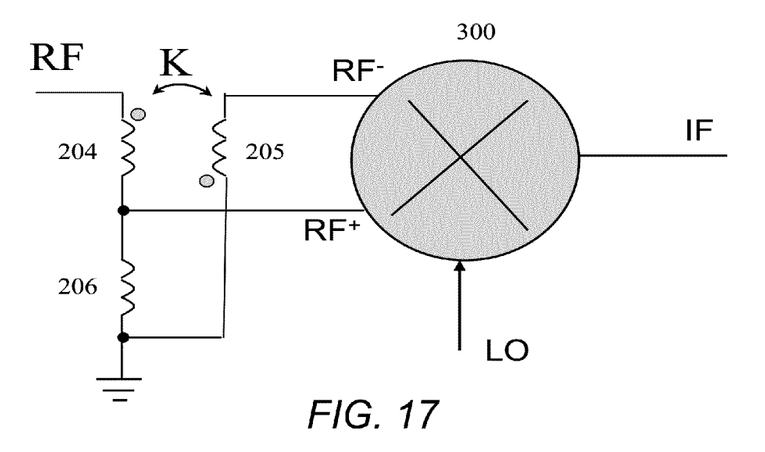
FIG. 17 illustrates a schematic of an example of a broadband mixer using the balun topology #1 shown in FIG. 9.

FIG. 17 illustrates a schematic of an example of a broadband mixer using the balun topology #1 shown in FIG. 9. A mixer core 300 can use either a passive or active mixer topology. The LO and IF port signals can be single-ended or differential. When the mixer core 300 is a passive mixer topology, the mixer can be used bi-directionally. When the RF port is used as the input and the IF port used as the output, the mixer may function as down converter. Alternately, the IF port can be used as the input with the RF port used as the output, in which case the mixer may function as an up converter. In the down converter case, the single-ended RF signal may be converted to differential signals (RF− and RF+) by the three-inductor balun and then applied to the mixer core. In the up converter case, the IF signal may be up-converted to differential RF signals which may then be converted to a single-ended RF output signal.

Figure 18:
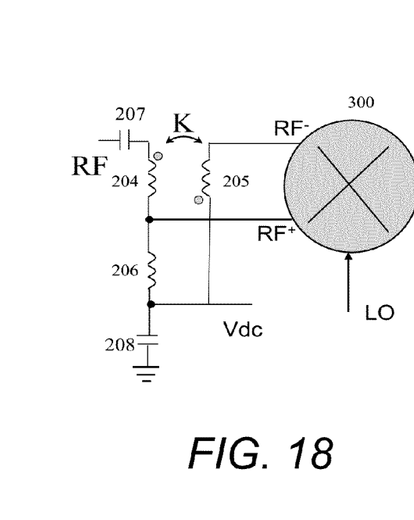
FIGS. 18 and 19 illustrate schematics of examples of different balanced broadband mixers.
Figure 19:
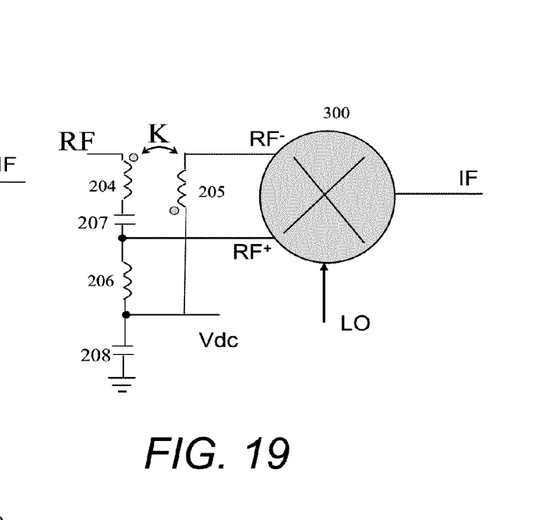

FIGS. 18 and 19 illustrate schematics of examples of different balanced broadband mixers that may utilize three baluns. In a traditional balun, the center tap of the secondary winding can be used as AC ground with DC voltage applied to provide bias voltage for the mixer circuit. When a DC bias voltage is needed in the proposed topology, a capacitor 207 may be added at either side of the inductor 204 of the three-inductor balun, as shown in FIGS. 18 and 19. The capacitor 208 may provide an AC ground and DC blocking. A DC voltage Vdc can be applied at the common node of the inductor 206 and the capacitor 208. DC current may flow through the inductors 206 and 205 to supply the mixer core 300 circuitry. No current may flow to the RF terminal due to capacitor 207.

Figure 20:
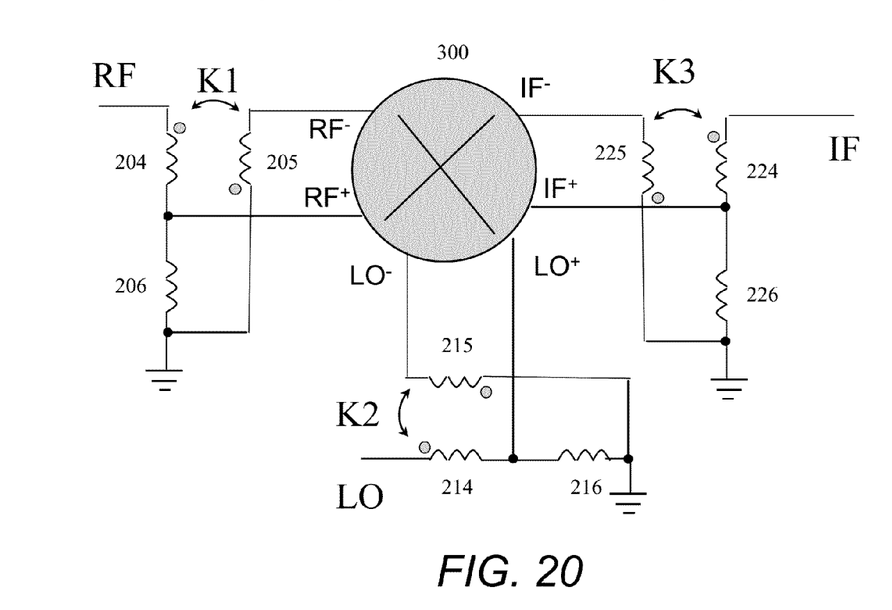
FIG. 20 illustrates a schematic of an example of a broadband mixer that uses three inductor baluns, one at each port.

FIG. 20 illustrates a schematic of an example of a broadband mixer that uses three inductor baluns, one at each port. In addition to the balun formed by the inductors 204, 205, and 206, a second balun of the same type may utilize inductors 214, 215, and 216, and a third balun of the same type may utilize inductors 224, 225, and 226. The three-inductor baluns can be used at the LO and IF ports in addition to the RF port, as shown in the integrated mixer circuit in FIG. 20. In this case, the RF, LO and IF ports may all be single-ended signals that may be converted to differential signals, as required for the double-balanced mixer topology. In the case of a passive diode mixer core, a star or ring configuration may be used and the single-ended IF signal can be realized directly without the need of a balun. In this case, the IF balun in FIG. 20 may not be needed.

The inductor values of the three baluns in FIG. 20 may not necessarily be the same. The IF frequency may be lower than the RF and LO frequencies, so higher inductance values may be needed in the IF balun, which may result in a larger balun. For this reason, it may not be practical to integrate the IF balun for IF frequencies lower than about 200 MHz. in this case, an external IF balun can instead be used and the IF output of the integrated mixer may be differential.

Figure 21:
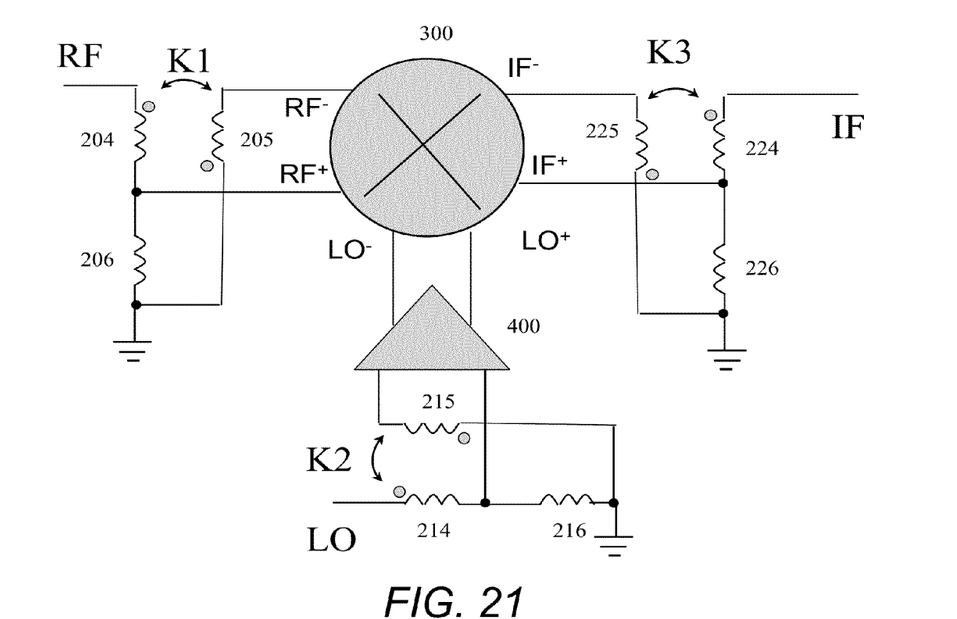
FIG. 21 illustrates a schematic of an example of a broadband mixer that uses three inductor baluns, one at each port, and a LO buffer amplifier.

FIG. 21 illustrates a schematic of an example of a broadband mixer that uses three inductor baluns, one at each port, and a LO buffer amplifier 400. The LO buffer amplifier 400 can be integrated with the mixer circuit, as shown in FIG. 21, to reduce the required LO input drive power level. A differential LO buffer may be used over a single-ended LO buffer because it may result in lower LO power leakage to the other mixer ports. Thus, the LO buffer 400 can be added before the mixer and after the balun as shown in FIG. 21.

Figure 22A:
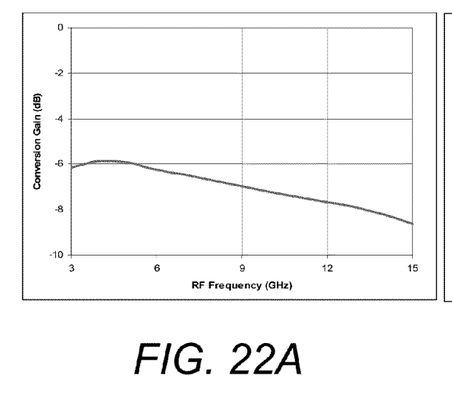
FIGS. 22A and 22B illustrate simulated performance of an example of a broadband mixer similar to the one illustrated in FIG. 21.
Figure 22B:
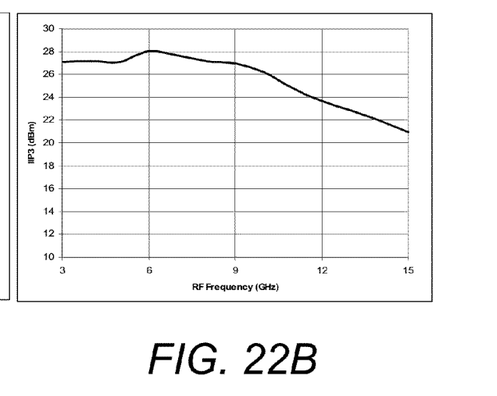

FIGS. 22A and 22B illustrate performance of an example of a broadband mixer that was similar to the one illustrated in FIG. 21. The example used a passive bidirectional mixer fabricated using a commercial 0.18 um BiCMOS process. The mixer core was realized using MOSFET switches.

Figure 23A:
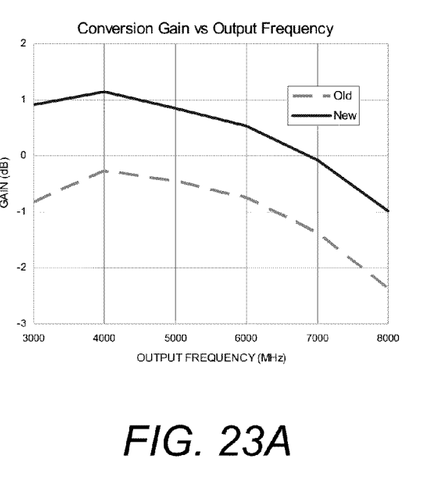
FIGS. 23A and 23B illustrate simulated performance of an example of a balun similar to the one illustrated in FIGS. 15 and 16'
Figure 23B:
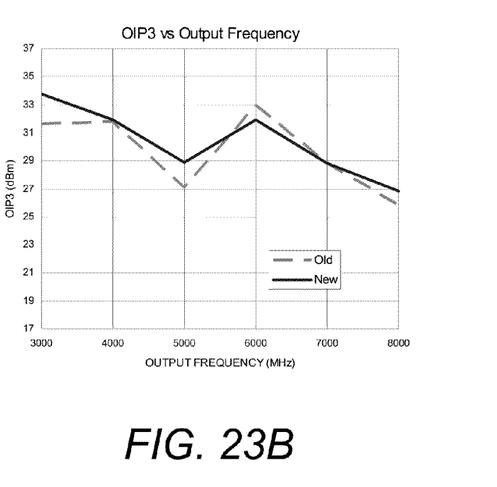

FIGS. 23A and 23B illustrate the simulated performance of an example of a balun that was similar to the one illustrated in FIGS. 15 and 16. Both of the transformer structures of traditional integrated balun and the proposed balun in FIG. 15 were modeled using an EM simulator and the resulting S-parameters were used in the output of a new active mixer design. The conversion gain with the new transformer was approximately 1.5 dB higher than with the old topology. The linearity performance with the new balun topology was essentially unaffected by the new topology, as shown by comparing OIP3 performance in FIG. 23B.

Figure 24:
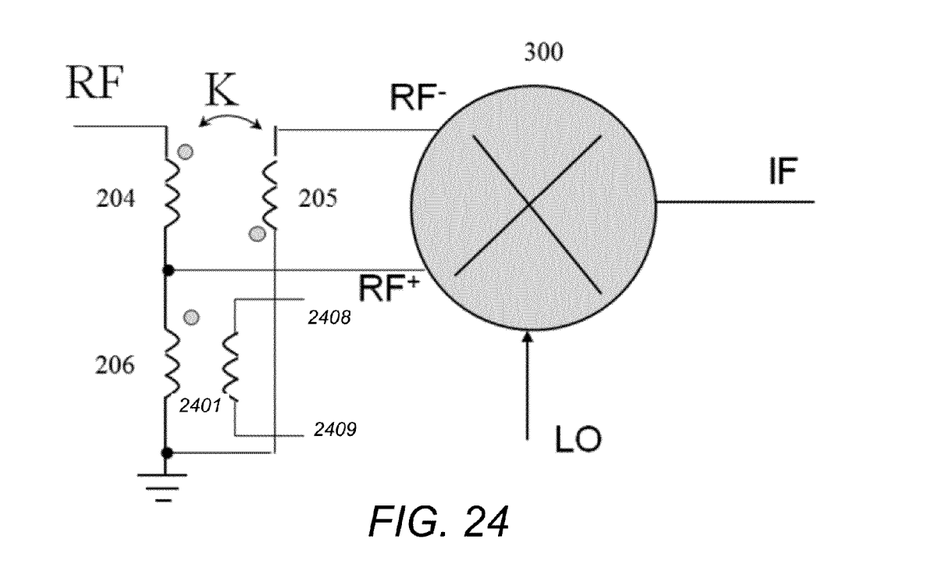
FIG. 24 illustrates another example of a broadband mixer.

FIG. 24 illustrates another example of a broadband mixer. A dummy inductor 2401 can be added to the balun of the mixer circuits shown in FIG. 17. The dummy inductor 2401 can be coupled either positively or negatively to the inductor 206 of the balun and may make the balun more symmetrical by equalizing the parasitics of the balanced ports of the balun. Terminals 2408 and 2409 of the dummy inductor 2401 may be left open circuited, connected to ground, or connected to a desired impedance.

Other circuits that can use the balun topology discussed herein are single-sideband mixers, I-Q modulators, and I-Q demodulators. These may use two of the proposed mixers.

The components, steps, features, objects, benefits, and advantages that have been discussed are merely illustrative. None of them, nor the discussions relating to them, are intended to limit the scope of protection in any way. Numerous other embodiments are also contemplated. These include embodiments that have fewer, additional, and/or different components, steps, features, objects, benefits, and/or advantages. These also include embodiments in which the components and/or steps are arranged and/or ordered differently.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

All articles, patents, patent applications, and other publications that have been cited in this disclosure are incorporated herein by reference.

The phrase "means for" when used in a claim is intended to and should be interpreted to embrace the corresponding structures and materials that have been described and their equivalents. Similarly, the phrase "step for" when used in a claim is intended to and should be interpreted to embrace the corresponding acts that have been described and their equivalents. The absence of these phrases from a claim means that the claim is not intended to and should not be interpreted to be limited to these corresponding structures, materials, or acts, or to their equivalents.

The scope of protection is limited solely by the claims that now follow. That scope is intended and should be interpreted to be as broad as is consistent with the ordinary meaning of the language that is used in the claims when interpreted in light of this specification and the prosecution history that follows, except where specific meanings have been set forth, and to encompass all structural and functional equivalents.

Relational terms such as "first" and "second" and the like may be used solely to distinguish one entity or action from another, without necessarily requiring or implying any actual relationship or order between them. The terms "comprises," "comprising," and any other variation thereof when used in connection with a list of elements in the specification or claims are intended to indicate that the list is not exclusive and that other elements may be included. Similarly, an element preceded by an "a" or an "an" does not, without further constraints, preclude the existence of additional elements of the identical type.

None of the claims are intended to embrace subject matter that fails to satisfy the requirement of Sections 101, 102, or 103 of the Patent Act, nor should they be interpreted in such a way. Any unintended coverage of such subject matter is hereby disclaimed. Except as just stated in this paragraph, nothing that has been stated or illustrated is intended or should be interpreted to cause a dedication of any component, step, feature, object, benefit, advantage, or equivalent to the public, regardless of whether it is or is not recited in the claims.

The abstract is provided to help the reader quickly ascertain the nature of the technical disclosure. It is submitted with the understanding that it will not be used to interpret or limit the scope or meaning of the claims. In addition, various features in the foregoing detailed description are grouped together in various embodiments to streamline the disclosure. This method of disclosure should not be interpreted as requiring claimed embodiments to require more features than are expressly recited in each claim. Rather, as the following claims reflect, inventive subject matter lies in less than all features of a single disclosed embodiment. Thus, the following claims are hereby incorporated into the detailed description, with each claim standing on its own as separately claimed subject matter.

The invention claimed is:

1. A broadband radio frequency, microwave, or millimeter mixer system comprising:
   a balun that has:
      an unbalanced port;
      a balanced port;
      a first and a second inductor tightly and inversely magnetically coupled to one another; and
      a third inductor which is not magnetically coupled to the first or the second inductors; and
   a mixer connected to the balanced port of the balun,
   wherein the balun, including its three inductors, and the mixer are all integrated onto a single substrate that forms an integrated circuit.

2. The mixer system of claim 1 wherein two of the inductors are connected in series.

3. The mixer system of claim 2 wherein the first and the third inductor are connected in series.

4. The mixer system of claim 2 wherein one of the inductors is not electrically connected to the other two.

5. The mixer system of claim 1 wherein the unbalanced port is an input to the mixer.

6. The mixer system of claim 5 wherein the mixer functions as an up converter.

7. The mixer system of claim 5 wherein the mixer functions as a down converter.

8. The mixer system of claim 1 wherein the unbalanced port is an output from the mixer.

9. The mixer system of claim 8 wherein the mixer functions as an up converter.

10. The mixer system of claim 8 wherein the mixer functions as a down converter.

11. The mixer system of claim 1 further comprising a second balun.

12. The mixer system of claim 11 further comprising a third balun.

13. The mixer system of claim 1 further comprising a capacitance in series with one of the inductors.

14. The mixer system of claim 1 further comprising a capacitance that DC isolates the third inductor from ground.

15. The mixer system of claim 1 wherein the mixer is an active mixer.

16. The mixer system of claim 1 wherein the mixer is a passive mixer.

17. The mixer system of claim 1 further comprising an amplifier between the balun and the mixer.

18. The mixer system of claim 17 wherein the amplifier is a differential amplifier.

19. The mixer system of claim 1 wherein all of the three inductors lie in the same plane.

20. The mixer system of claim 1 wherein two of the three inductors lie in a different plane.

* * * * *